(12) United States Patent
Sato et al.

(10) Patent No.: US 7,774,154 B2
(45) Date of Patent: Aug. 10, 2010

(54) TEST UNIT AND TEST APPARATUS

(75) Inventors: Norimasa Sato, Tokyo (JP); Kenji Inaba, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 11/811,291

(22) Filed: Jun. 8, 2007

(65) Prior Publication Data
US 2008/0281538 A1   Nov. 13, 2008

(30) Foreign Application Priority Data
May 8, 2007   (JP)   ............................. 2007-123568

(51) Int. Cl.
*G06F 19/00*   (2006.01)
*G06F 17/40*   (2006.01)

(52) U.S. Cl. ........................ 702/117; 324/537; 702/66; 702/187; 702/189

(58) Field of Classification Search ................. 702/117, 702/1, 57, 66, 108, 116, 118, 121, 124, 126, 702/127, 187, 189, 198, 199; 340/384.72, 340/853.3; 367/44; 386/92; 324/76.11, 324/500, 512, 537, 555, 600, 602, 605, 607, 324/754, 755, 759, 763, 765; 341/126, 141, 341/155
See application file for complete search history.

(56) References Cited

U.S. PATENT DOCUMENTS

| | | | | |
|---|---|---|---|---|
| 2,950,437 A | * | 8/1960 | Stahl | 324/73.1 |
| 2,987,704 A | * | 6/1961 | Gimpel et al. | 346/34 |
| 3,082,374 A | * | 3/1963 | Buuck | 324/73.1 |
| 3,219,927 A | * | 11/1965 | Topp, Jr. et al. | 714/735 |
| 3,465,360 A | * | 9/1969 | Johnson et al. | 346/34 |
| 3,976,940 A | * | 8/1976 | Chau et al. | 714/736 |
| 4,092,589 A | * | 5/1978 | Chau et al. | 714/736 |
| 4,161,782 A | * | 7/1979 | McCracken | 702/6 |
| 4,222,275 A | * | 9/1980 | Sholl et al. | 73/636 |
| RE31,056 E | * | 10/1982 | Chau et al. | 714/700 |
| RE31,222 E | * | 4/1983 | McCracken | 702/6 |
| 4,748,573 A | * | 5/1988 | Sarandrea et al. | 702/108 |
| 4,928,246 A | * | 5/1990 | Crawley et al. | 700/8 |
| 5,062,101 A | * | 10/1991 | Dejewski | 398/98 |
| 5,686,917 A | * | 11/1997 | Odom et al. | 341/141 |
| 5,689,347 A | * | 11/1997 | Naoi | 358/444 |
| 5,703,584 A | * | 12/1997 | Hill | 341/141 |
| 6,297,760 B1 | * | 10/2001 | Hungerbuehler et al. | 341/155 |
| 6,333,708 B1 | * | 12/2001 | Hungerbuehler et al. | 341/155 |
| 6,615,148 B2 | * | 9/2003 | Pickerd | 702/66 |
| 6,661,248 B2 | * | 12/2003 | Mori et al. | 324/765 |
| 6,717,541 B1 | * | 4/2004 | Carter-Lewis et al. | 341/155 |
| 6,931,579 B2 | * | 8/2005 | Roberts et al. | 714/724 |

(Continued)

FOREIGN PATENT DOCUMENTS

JP   04-36671   6/1992

*Primary Examiner*—Edward R Cosimano
(74) *Attorney, Agent, or Firm*—Martine, Penilla & Gencarella, LLP

(57) ABSTRACT

In the digitizer, a plurality of ADCs convert a plurality of analogue signals output from the device to be tested, to digital signals, respectively. The processing circuit is configured as a software-independent circuit and processes a plurality of digital signals output from the plurality of ADCs. The processing circuit is formed on the FPGA. In the processing circuit, the FFT circuit performs complex Fourier transform on two digital signals.

2 Claims, 4 Drawing Sheets

U.S. PATENT DOCUMENTS

| | | | |
|---|---|---|---|
| 7,026,969 B2 * | 4/2006 | Shim et al. | 341/141 |
| 7,030,796 B2 * | 4/2006 | Shim et al. | 341/141 |
| 7,096,139 B2 * | 8/2006 | Miyazaki et al. | 702/117 |
| 7,227,489 B2 * | 6/2007 | Tryggvason et al. | 341/155 |
| 7,237,167 B2 * | 6/2007 | Inaba et al. | 714/740 |
| 7,275,197 B2 * | 9/2007 | Inaba et al. | 714/740 |
| 7,515,077 B2 * | 4/2009 | Oak | 341/141 |
| 2002/0019962 A1 * | 2/2002 | Roberts et al. | 714/724 |
| 2005/0012868 A1 * | 1/2005 | Shim et al. | 348/705 |
| 2005/0182583 A1 * | 8/2005 | Miyazaki et al. | 702/117 |
| 2005/0193298 A1 * | 9/2005 | Inaba et al. | 714/726 |
| 2005/0240852 A1 * | 10/2005 | Inaba et al. | 714/740 |
| 2006/0012498 A1 * | 1/2006 | Shim et al. | 341/120 |
| 2006/0132346 A1 * | 6/2006 | Tryggvason et al. | 341/155 |
| 2008/0215264 A1 * | 9/2008 | Spanier et al. | 702/62 |
| 2009/0096654 A1 * | 4/2009 | Zhu et al. | 341/155 |

* cited by examiner

TEST UNIT AND TEST APPARATUS

BACKGROUND OF THE INVENTION

1. Field of the Invention

The present invention relates to a technique in which a plurality of digital signals to be tested are processed.

2. Description of the Related Art

In a test of a semiconductor device provided with an analogue circuit, analogue signals output from a device to be tested are converted into digital signals by an analogue-digital converter (hereinafter sometimes referred to as "ADC"), and the digital signals are analyzed, so as to determine whether the device is good or not. For example, Patent Document 1 discloses a test apparatus for testing large-scale ICs (LSIs) which transmits/receives both digital and analogue signals. The test apparatus is composed of a plurality of sub-systems. In the test apparatus, a waveform digitizer sub-system (WD-SS) is provided with a DSP which performs a desired calculation on digital signals digitized by an ADC.

Parent Document 1: Japanese Patent Publication Laid-open No. Hei 4-36671.

As communication apparatuses have been widely in use, communication devices have been actively developed and produced, therefore, it is strongly requested to perform tests for such devices effectively. For example, in a modulation device for transmitting signals, I component (in-phase component) baseband modulated signal and Q component (orthogonal component) baseband modulated signal are generated. It is preferable that a test apparatus can test two types of signals in a shorter time and effectively. Further, in an analogue test, a determination may be made as to whether a device is good or not, by referring to the mutual relations between multiple types of signals output from the analogue circuit. Therefore, a technique which can effectively test multiple types of signals is strongly desired.

SUMMARY OF THE INVENTION

The present invention has been made in view of these circumstances and a general purpose of the invention is to provide a technique which can test a digital signal to be tested effectively.

To solve the aforementioned problem, a test unit apparatus of an embodiment of the present invention includes a plurality of memories which hold a plurality of digital signals to be tested; and a hardware processing circuit which reads out and processes the plurality of digital signals which are held in the plurality of memories, simultaneously.

The hardware processing circuit may be configured as a hardware circuit composed of a dedicated wired logic, or as a hardware circuit selectably structured on a FPGA (Field Programmable Gate Array) along with other processing circuits. In a case a plurality of processing circuits are structured on the FPGA in advance, a hardware circuit may be selected in which an appropriate logic is configured in accordance with a test by, for example, setting values of registers or the like by software. Alternatively, the hardware processing circuit may be dynamically configured on the FPGA as may be necessary. In the test unit apparatus of the embodiment, intervention of software may be acceptable to configure the hardware processing circuit; however, the hardware processing circuit must process a plurality of digital signals to be tested by hardware after the test has started.

According to the embodiment, since the hardware processing circuit processes digital signals by hardware, a processing time can be reduced more greatly than when digital signals are processed by software. Further, this hardware processing circuit can read out and process a plurality of digital signals simultaneously, thereby, a processing time can be reduced more greatly than when the digital signals are processed individually, which leads to reduction in a test time. Still further, the relations between the digital signals can be easily analyzed since the hardware processing circuit performs a certain processing on a plurality of digital signals to be tested.

The test unit apparatus may be further provided with a plurality of analogue-digital conversion units which convert a plurality of analogue signals output from a device to be tested into the digital signals, respectively. In the case, the test unit apparatus may be structured as a waveform digitizer. When the waveform digitizer has a function by which the plurality of digital signals to be tested can be processed simultaneously, a test time using a test apparatus with such a waveform digitizer can be reduced.

The hardware processing circuit may perform complex Fourier transform on two digital signals. Two digital signals to be tested can be subject to FFT processing simultaneously by forming a complex FFT (Fast Fourier Transform) circuit as a hardware processing circuit.

Another embodiment of the present invention is a test apparatus. This apparatus is provided with the test unit apparatus which can process a plurality of digital signals to be tested. This test unit apparatus may be the test unit apparatus of the aforementioned embodiment.

Note that any combination of the aforementioned components or any manifestation of the present invention exchanged between methods, devices, systems and so forth, is effective as an embodiment of the present invention.

DETAILED DESCRIPTION OF THE INVENTION

The invention will now be described by reference to the preferred embodiments. This does not intend to limit the scope of the present invention, but to exemplify the invention.

Figure 1:
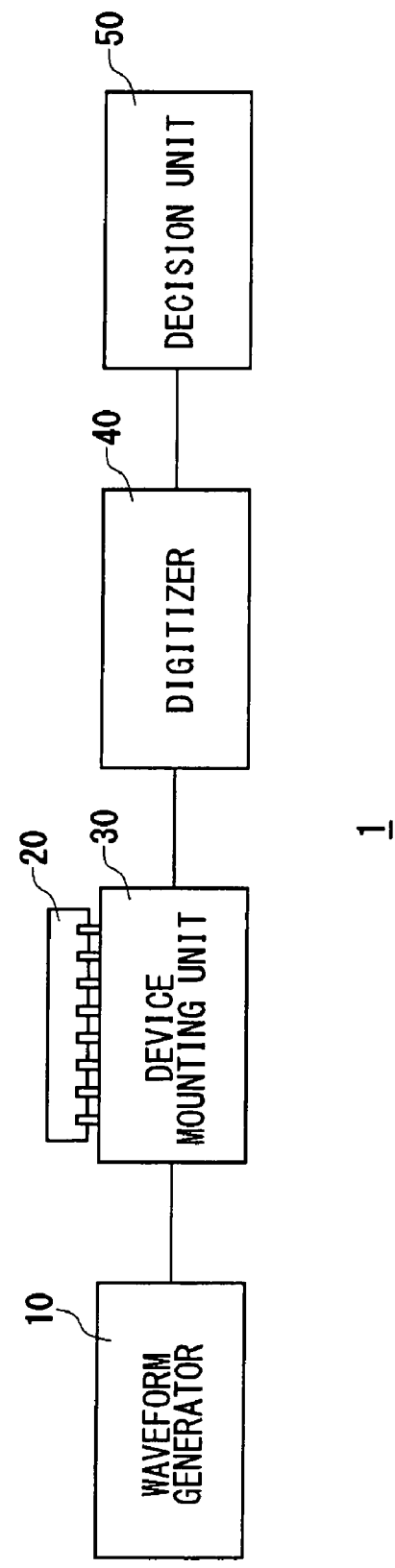
FIG. 1 is a diagram which shows an example of a structure of a test apparatus in accordance with an embodiment of the present invention.

FIG. 1 is a diagram which shows an example of a structure of a test apparatus in accordance with an embodiment of the present invention. The test apparatus 1 is used for testing a device 20, and includes a waveform generator 10, a device mounting unit 30, a digitizer 40, and a decision unit 50. In the present embodiment, the device 20 to be tested is a semiconductor device which is provided with a analogue circuit, and is mounted to the device mounting unit 30. The device mounting unit 30 may be a performance board which has an electrical connecting point connected to the device 20 to be tested.

The waveform generator 10 generates test signals which are provided to the circuit of the device 20 to be tested. The device mounting unit 30 inputs test signals into the device 20 to be tested, and provides output signals from the device 20 to the digitizer 40. The digitizer 40 converts analogue signals output from the device 20 to digital signals to be tested, and performs predetermined processing such as Fourier Transform. The decision unit 50 determines whether the device 20 under test is good or not, based on signals provided by the digitizer 40. The decision unit 50 may determine whether the device 20 is good or not by comparing signals provided by the digitizer 40 with expected signals which are expected to be output from the device 20. Alternatively, the decision unit 50 may determine whether the device 20 to be tested is good or not by comparing the result analyzed based on signals which are provided by the digitizer 40 with expected analysis values.

In the present embodiment, the device 20 to be tested is a device which outputs multiple types of analogue signals simultaneously. By way of example, the device 20 to be tested is assumed to be a device for communication which outputs I component (in-phase component) baseband modulated signal and Q component (orthogonal component) baseband modulated signal. The digitizer 40, upon receiving two channels of analogue outputs from the device 20 to be tested, converts them to the digital signals to be tested, respectively, and performs FFT processing. The decision unit 50 evaluates the frequency characteristic of each baseband modulated signal, based on the result of FFT processing, and may determine whether the device 20 is good or not, by determining whether each spectrum falls within a predetermined band or not. A device for communication is only one example, and the device 20 to be tested may be another type of device which outputs multiple types of analogue signals simultaneously.

Figure 2:
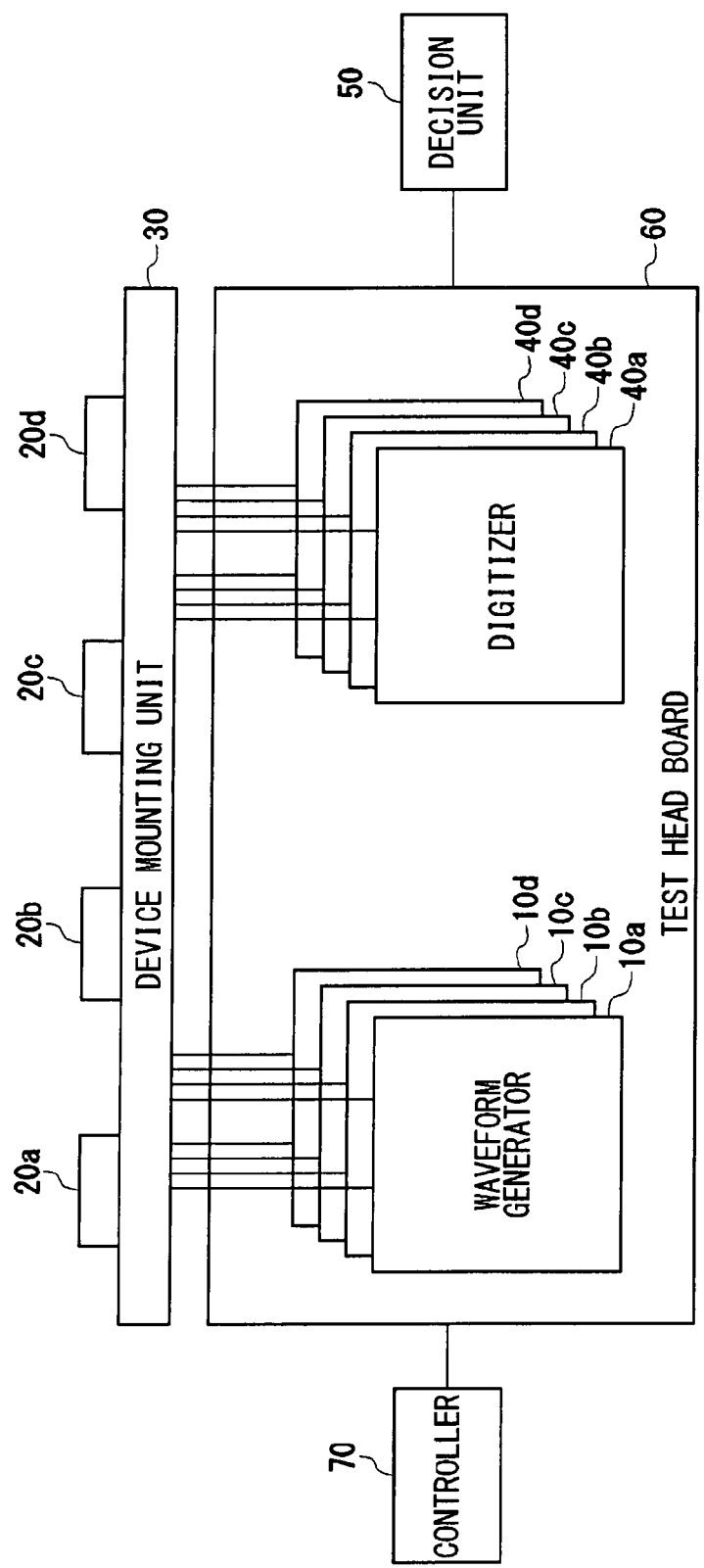
FIG. 2 is a diagram which shows an example of a structure of a test apparatus in which a parallel processing is realized.

FIG. 2 shows an example of a structure of the test apparatus 1 in which parallel processing is realized. In the test apparatus 1 shown in FIG. 2, a plurality of waveform generators 10a to 10d and digitizers 40a to 40d are installed on the test head board 60, to test a plurality of devices 20a to 20d. The test head board 60 is a module for test which is provided with FPGA. A plurality of waveform generators 10a to 10d and at least a part of logics of the digitizers 40a to 40d, are formed on the FPGA. The test head board 60 is provided on the test head to be electrically connected to the device mounting unit 30. While FIG. 2 shows only one test head board 60, many devices 20 can be tested simultaneously by installing a plurality of test head boards 60 on a test head. The controller 70 controls operations of each component in the test apparatus 1, and controls settings and execution of test in accordance with an operation input from a user.

In the test head board 60, a plurality of waveform generators 10 and digitizers 40 are configured in parallel as hardware circuits. Hence, parallel processing by hardware is attained, leading to a significant reduction in a test time. For example, in case output signals from the device 20 to be tested are FFT processed, performing FFT processing by software with use of the controller 70 makes a whole test time longer, since signals which are converted from analogue to digital by the each digitizer 40 are processed sequentially. On the other hand, in the test apparatus 1 of the present embodiment, a plurality of digitizers 40, which are provided with FFT circuits in hardware, can perform FFT processing simultaneously and at a high speed.

Figure 3:
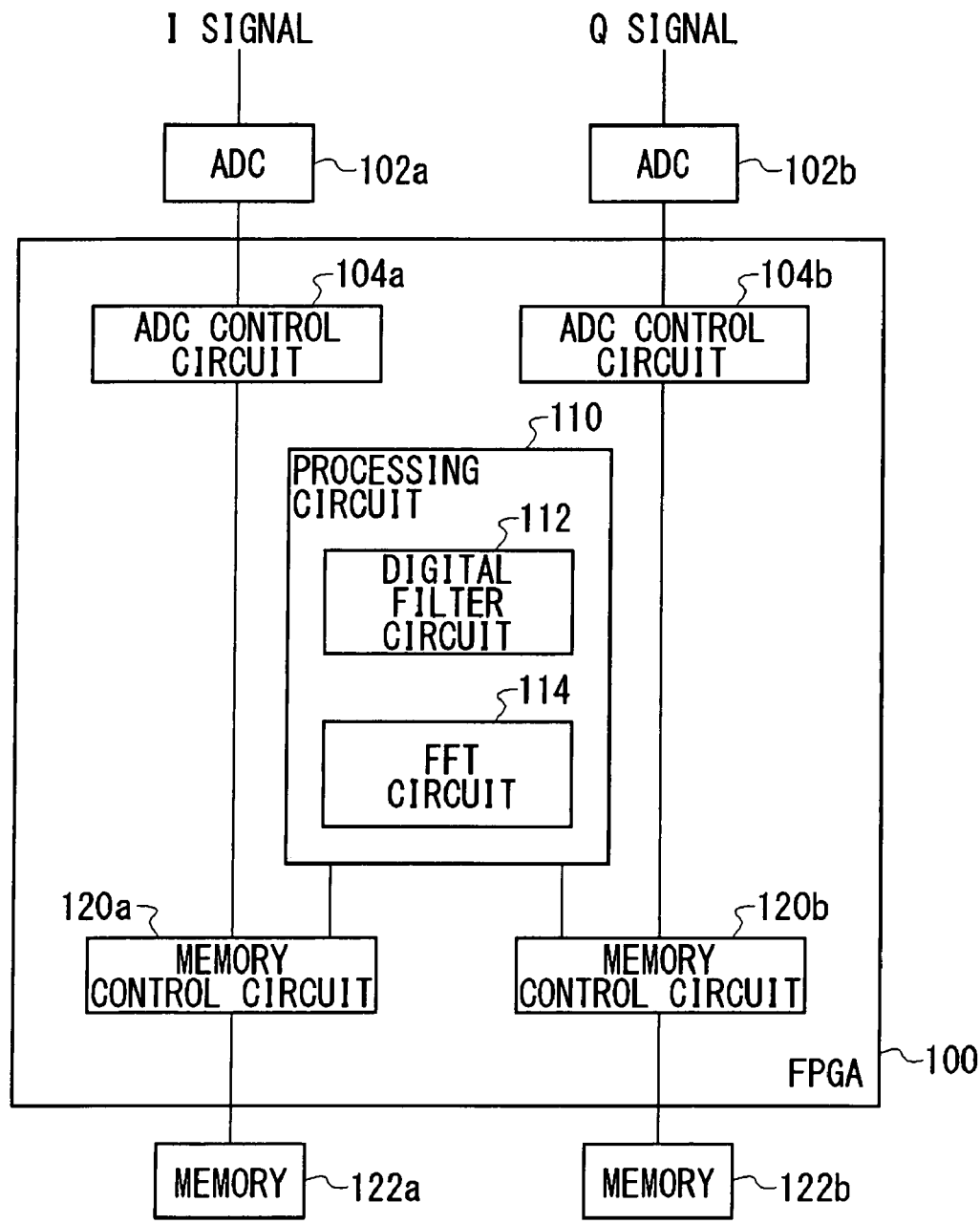
FIG. 3 is a diagram which shows an example of a structure of a digitizer.

FIG. 3 shows an example of a structure of the digitizer 40. The digitizer 40 is a test unit apparatus including the FPGA 100, ADCs 102a and 102b, and memories 122a and 122b. The ADCs 102 are provided in accordance with the number of the output channels of the device 20 to be tested. In the present embodiment, two ADCs 102 are provided since I signal and Q signal are output from the device 20 to be tested. The ADC 102a is a circuit in which baseband I signal is converted from analogue to digital, whereas the ADC 102b is a circuit in which baseband Q signal is converted from analogue to digital. The memory 122a stores the processed data with respect to I signals, whereas the memory 122b stores the processed data with respect to Q signals. The memories 122a and 122b may be configured as physically different modules, or configured as the same module.

In the FPGA 100, the ADC control circuits 104a and 104b, processing circuit 110, and memory control circuits 120a and 120b, are formed as hardware circuits. The processing circuit 110 includes the digital filter circuit 112 and FFT circuit 114 which are formed as hardware circuits. The FPGA 100 may further be provided with another processing circuit, and processing circuits may be selected appropriately and used in accordance with the test contents. In the FPGA 100 of the present embodiment, intervention of software is not allowed while signal are being processed by the processing circuit 110, therefore signals being processed solely by hardware. The digitizer 40 is provided with one digital filter circuit 112 and one FFT circuit 114.

Figure 4:
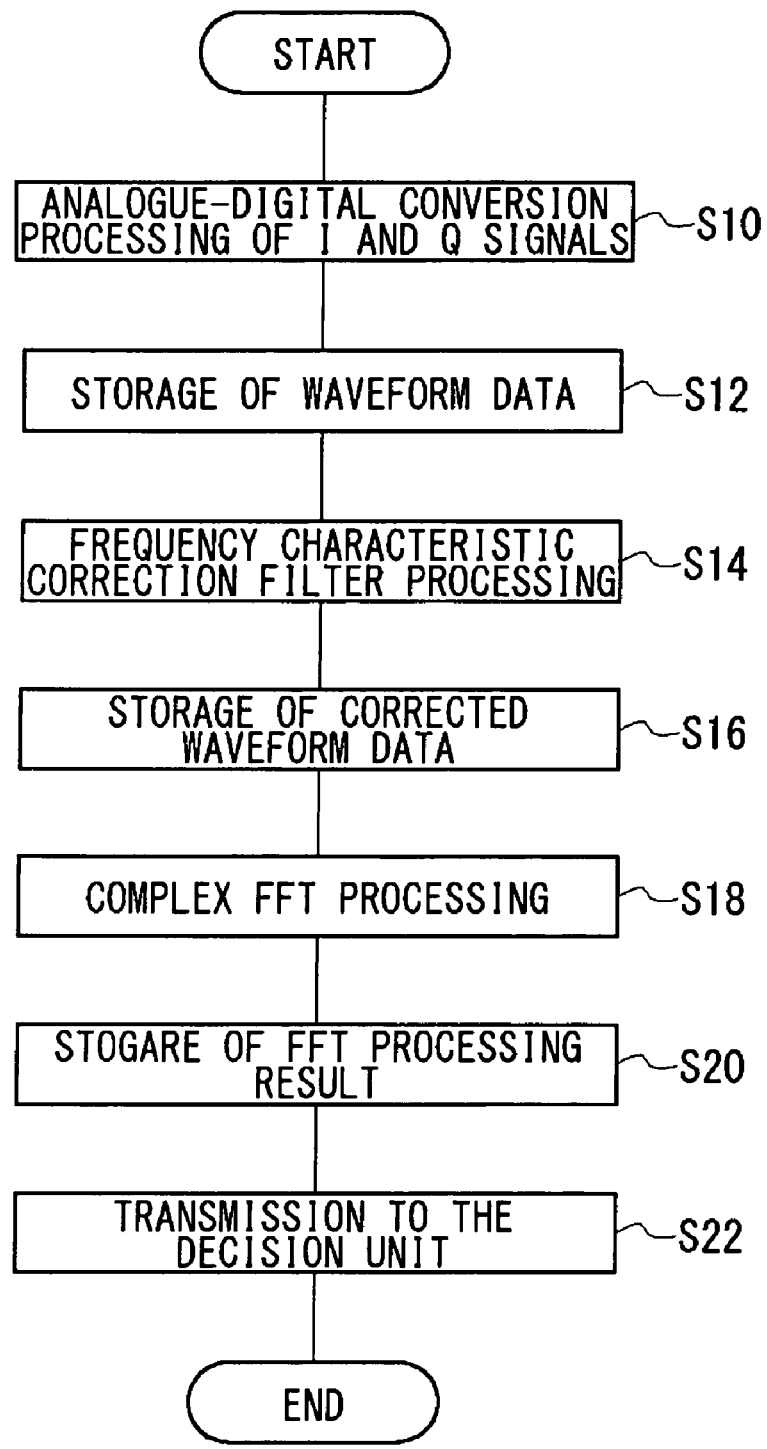
FIG. 4 is a flow chart which shows the processing flow in a digitizer.

FIG. 4 is a flow chart showing the processing flow in the digitizer 40. When the device 20 outputs baseband I and Q signals in accordance with test signals, the ADC 102a converts the I signal to digital and the ADC 102b converts the Q signal to digital (S10). The analogue-digital conversion processing by ADCs 102a and 102b is controlled by the ADC control circuits 104a and 104b, respectively. The memory control circuit 120a stores the waveform data which is digitized by the ADC 102a into the memory 122a, and the memory control circuit 120b stores the waveform data which is digitized by the ADC 102b into the memory 122b (S12). Each waveform data corresponds to the digital test signal to be tested.

Then, the memory control circuits 120a and 120b read out the waveform data stored in the memories 122a and 122b into the digital filter circuit 112. The memory control circuits 120a and 120b may be controlled by the controller 70 in the process of reading out the waveform data. The digital filter circuit 112, to improve the accuracy of measurements, executes the frequency characteristic correction filter processing which corrects the frequency characteristic of the signal path (S14). Configuring the digital filter circuit 112 as a hardware processing circuit allows the frequency characteristic correction filter processing to be executed at a higher speed than that of when the filter processing is executed by software, thereby leading to reduction in a test time. Further, since the waveform data of the I and Q signals can be corrected by the single digital filter circuit 112, the resources of the FPGA 100 can be utilized effectively. The memory control circuit 120a stores the corrected waveform data of the I signal into the memory 122a, and the memory control circuit 120b stores the corrected waveform data of the Q signal into the memory 122b (S16). Each corrected waveform data corresponds to the digital test signal to be tested.

The memory control circuits 120a and 120b read out the corrected waveform data which are stored in the memories 122a and 122b, into the FFT circuit 114 simultaneously. The memory control circuits 120a and 120b may be controlled by the controller 70 so as to read out the waveform data simultaneously. The FFT circuit 114, upon receiving the corrected waveform data of the I and Q signals, performs complex Fourier transform (S18).

The present inventor has acquired knowledge that performing FFT processing by hardware can especially obtain the highest reduction rate in the test time in the analogue test, after many simulations have been performed under various test conditions such as measurement frequency. Based on the knowledge, the inventor has configured the FFT circuit 114 as a hardware processing circuit on the FPGA 100. Configuring the FFT circuit 114 as a hardware circuit allows FFT processing to be performed at a higher speed than that of when FFT processing is executed by software, thereby leading to the effective reduction in a test time in various analogue tests. AS described before, the functions of the FFT circuit 114 may be determined by setting registers or the like by software; however, processing by hardware is solely performed without any intervention of processing by software, while FFT processing is performed.

Further, in the FPGA 100, configuring the FFT circuit 114 which is capable of simultaneously processing two waveform data representing I component and Q component, allows the FFT processing to be completed at one time, thereby leading to reduction in the FFT processing time. Thus, configuring the FFT circuit 114 as a hardware processing circuit, and further processing a plurality of digital data simultaneously, lead to reduction in the whole test time. The memory control circuit 120*a* or 120*b* stores the result of FFT processing into the memories 122*a* or 122*b* (S20). Alternatively, the memory control circuit 120 may store the result of FFT processing into another memory which is not shown. The memory control circuit 120 transmits the result of FFT processing to the decision unit 50 via a bus I/F which is not shown (S22).

The decision unit 50, upon receiving the result of FFT processing, analyzes the frequency characteristic of the I and Q components, and then analyzes the balance bias between the I and Q components. Thereby, the decision unit 50 determines whether the device 20 is good or not.

The present invention should not be limited to the aforementioned embodiments, and any appropriate combination of each component of the embodiments is effective as an embodiment of the present invention. In addition, it may be possible that various modifications such as design alterations would be added to the embodiments based on the knowledge of those skilled in the art, and such modified embodiments would fall within the scope of the present invention. In the above embodiment, the circuit which performs complex FFT processing is exemplified as a circuit which processes two digital data simultaneously; however, in case a set of data are composed of multiple digital data, a circuit, which simultaneously processes the set of data, may be formed on the FPGA 100. The present embodiment shows the test apparatus 1 which evaluates the base band modulated signals. A test apparatus which evaluates another type of analogue signals should fall within the scope of the present invention.

The controller 70 may have a function which sets the operation mode of, for example, the digitizer 40. The controller 70 may set the operation mode of the FFT circuit 114 based on a user's instruction designating whether two data are simultaneously processed by complex FFT, or only one data is processed by FFT.

Further, the analogue-digital conversion function of the ADC 102 may be provided on the side of the device 20 to be tested. In the case, with reference to FIG. 1, the test apparatus 1 is configured by substituting a digital capture apparatus, as a test unit apparatus, for the digitizer 40. The digital capture apparatus is made by omitting the ADC from the structure of the digitizer 40 shown in FIG. 3.

What is claimed is:

1. A test apparatus provided with a test unit apparatus which processes a plurality of digital signals to be tested and a decision unit for determining a device to be tested is good or not, wherein the test unit apparatus comprises,
   a plurality of analogue-digital conversion units which convert a plurality of analogue signals output from a device to be tested into the corresponding plurality of digital signals, wherein the analogue signals output from the device are of different types;
   a plurality of memories which hold the plurality of digital signals to be tested; and
   a hardware processing circuit which reads out and performs complex Fast Fourier transform on the plurality of digital signals which are held in the plurality of memories, simultaneously,
   wherein the decision unit is configured to,
      a) receive result of the complex Fast Fourier transform from the hardware processing circuit;
      b) analyze the result received from the hardware processing unit;
      c) determine whether the device is good or not based on the analysis.

2. The test apparatus according to claim 1, wherein the hardware processing circuit is configured on a FPGA.

* * * * *